US006773854B2

(12) United States Patent
Ehrmann et al.

(10) Patent No.: US 6,773,854 B2
(45) Date of Patent: Aug. 10, 2004

(54) METHOD OF PRODUCING A PERFORATED MASK FOR PARTICLE RADIATION

(75) Inventors: Albrecht Ehrmann, Krailing (DE); Ernst Haugeneder, Vienna (AT); Frank-Michael Kamm, Unterhaching (DE); Alexander Petraschenko, München (DE); Stefan Schunck, München (DE)

(73) Assignee: Infineon Technologies AG, Munich (DE)

( * ) Notice: Subject to any disclaimer, the term of this patent is extended or adjusted under 35 U.S.C. 154(b) by 166 days.

(21) Appl. No.: 10/210,011

(22) Filed: Jul. 31, 2002

(65) Prior Publication Data

US 2003/0059689 A1 Mar. 27, 2003

(30) Foreign Application Priority Data

Jul. 31, 2001 (DE) ........................................ 101 37 398

(51) Int. Cl.[7] ................................................ G03F 9/00
(52) U.S. Cl. ............................................. 430/5; 430/30
(58) Field of Search ............................... 430/5, 22, 30, 430/308

(56) References Cited

U.S. PATENT DOCUMENTS

| | | | | |
|---|---|---|---|---|
| 5,742,065 A | * | 4/1998 | Gordon et al. | 250/492.23 |
| 6,440,619 B1 | * | 8/2002 | Feldman | 430/30 |
| 6,447,964 B2 | * | 9/2002 | Okino et al. | 430/30 |
| 6,635,391 B2 | * | 10/2003 | Stearns et al. | 430/5 |

OTHER PUBLICATIONS

K. J. Bathe: "Finite Element Procedures", 1st ed., Prentice–Hall, 1982, pp. 21–44.
O.C. Zienkiewicz: "The Finite Element Method", 4th ed., McGraw Hill, 1989, pp. 114–191.
Gary A. Frisque et al.: "Finite element modeling of ion–beam lithography masks for pattern transfer distortions", Part of the SPIE Conference on Emerging Lithographic Technologies III, Santa Clara, CA, Mar. 1999, pp. 768–778.

* cited by examiner

Primary Examiner—Mark F. Huff
Assistant Examiner—Saleha Mohamedulla
(74) Attorney, Agent, or Firm—Laurence A. Greenberg; Werner H. Stemer; Ralph E. Locher (57) ABSTRACT

A method for producing a perforated mask for particle radiation includes calculating values of an elasticity of adjacent cells of a mask with respect to longitudinal and shear stresses in a main plane of the mask on a model of the desired pattern of mask openings. For the respective individual cells, length and direction of all the edge sections of the openings and cross-sectional areas of the openings are determined. Therefrom, statistical parameters are derived, which are used as a variable in preselected empirical functions to determine the elasticity values of the cells analytically. By linking the elasticity values determined with deformation forces to be expected, the vector field of a distortion of the mask to be expected is calculated by FE calculation. For cutting the mask openings into a blank, a pattern is selected that represents the desired pattern with a distortion being the inverse of the previously calculated distortion.

11 Claims, 4 Drawing Sheets

$E_x'/E$ (Calculated Numerically)

Fig. 4

METHOD OF PRODUCING A PERFORATED MASK FOR PARTICLE RADIATION

BACKGROUND OF THE INVENTION

Field of the Invention

The invention relates to a method of producing a perforated mask having a desired pattern of perforations for the projection of particle radiation onto a projection area. The preferred field of application of the invention is the production of masks for electron or ion-beam lithography in the fabrication of integrated circuits, in particular, for the lithographic formation of very fine structures with dimensions below 130 nm.

To produce integrated circuits, various layers of selected semiconductor, conductor, and insulating materials are applied one after another to a wafer-like substrate, referred to as a wafer, and are each processed selectively in predefined areas to form fine structures in the layers. Lithographic processes configure the pattern of the respective structure, in that, radiation having an effect in the desired manner on the respective material to be treated is projected onto the relevant layer through a mask. The projection mask is constructed in accordance with the desired pattern so that only the areas to be treated are irradiated and the remaining areas are shielded from the radiation. The irradiated layer is normally a film of a "resist" material, whose irradiated areas are washed away after a development operation to expose the layer lying underneath selectively in accordance with the desired pattern and, therefore, to make it receptive to specific selective processing such as etching, semiconductor doping, vapor deposition.

The lithographic process that is most common at present is optical lithography (photolithography), which operates with optical irradiation. Projection masks for optical lithography include a carrier material that is transparent to the radiation used (in the case of transmission masks) or is reflective like a mirror (in the case of reflection masks) and bears a shielding layer in those portions of its area that are to let through or reflect no radiation to the object being exposed. The lower limit for the size of the structures that can be defined by optical projection is directly proportional to the wavelength of the light used and inversely proportional to the numerical aperture of the imaging system. With increasing miniaturization of integrated circuits, the development of optical lithography processes is, therefore, moving to shorter and shorter wavelengths as far as the ultra-violet (UV) range and even beyond that.

Although radiation in the UV range still permits projection techniques by optical lenses, it permits resolutions only down to a fineness of the order of magnitude of about 100 nm. To permit even smaller structure sizes, special projection techniques and masks for electromagnetic radiation in the X-ray range have been developed or proposed. Because, in the case of X-rays, no optical lenses can be used for the reduced imaging of a mask, the mask has to be formed as a "1:1 mask" on the same scale as the structures to be provided. In addition, because flooded exposure with an appropriately broad parallel X-ray beam cannot apply the necessary energy density to the irradiated area, the 1:1 mask, together with the wafer to be exposed, has to be subjected to a scanning movement relative to the source of a narrowly collimated X-ray beam, for example, relative to a synchrotron ring. X-ray lithography, therefore, requires a complicated and expensive apparatus and, because of the time-consuming mechanical scanning technique, is barely suitable for the mass production of integrated circuits.

In view of such a problem, more recent developments are aimed at implementing lithography for very small structures (for example below 130 nm) by particle radiation instead of by electromagnetic radiation. The particles to be used in such a case are electrons or ions that, because of their electric charge, can be accelerated and focused by electric or magnetic lenses so that reduced imaging of the mask pattern onto the projection area is also possible. With such particle radiation, much smaller structures can be formed on a projection area than by conventional optical radiation or by X-rays because the equivalent wavelength of electrons or ions is many times smaller than the wavelength of the shortest-wave electromagnetic radiation. Although no optical radiation is used in particle beam lithography, the expression "exposure" is commonly also used here for the selective irradiation procedure.

There are materials that are sufficiently sensitive to exposure with particles such as ions or electrons to form a useable resist for particle radiation lithography. On the other hand, there are no materials that are sufficiently transparent to ions to be able to serve as a transmitting carrier material for a projection mask. Although there are materials that are transparent to electrons, high transmission losses occur when they are used. Masks for ion projection lithography (IPL), therefore, have to be perforated masks, that is to say, to be of a diaphragm of a material that is opaque to the particles used and is perforated in accordance with the desired projection pattern. The use of such perforated masks is also desirable for electron projection lithography (EPL) to avoid the aforementioned transmission losses.

The narrower the mask openings formed by the perforation, the thinner must the diaphragm be so that the ratio of depth to width of the openings remains small. Lithography of small structures, therefore, requires very thin diaphragms. Furthermore, it is desirable to give the diaphragm as large an area as possible so that a sufficient number of pattern components-can be accommodated on it to cover an entire wafer by full area exposure and so that no time-consuming scanning or blockwise exposure of the wafer is necessary.

The required low thickness and the desired large area of the diaphragm, and also the presence of the perforation, leads to the mask having a relatively low stiffness with respect to mechanical stresses in the directions of its main plane. This means that longitudinal and shear forces in the directions of the main plane lead to distortions of the perforation pattern. Because the requirements on the accuracy of placement of the mask openings become higher and higher as the size of the exposure structures decreases, calculation of all the mechanical distortions that occur is necessary. To be able to calculate the distortions exactly in advance and compensate for them, both the stresses that act and the actual stiffness of the perforated diaphragm must be made available in all areas.

The mechanical stresses depend on parameters of the production process and also on external influences, for example, on the mounting, on thermal effects, ion implantation and so on, and may be predicted quantitatively or determined empirically. The stiffness of the diaphragm, on the other hand, is not only a function of the material and of the thickness but also depends on the shape of the perforation pattern, that is to say, on the form, the size, and the density of the mask openings, and can, therefore, be very different from place to place within the diaphragm. If the actual stiffness of the diaphragm and its local fluctuations have been determined, this information, together with the information about the mechanical stresses, can be used to calculate the distortion that occurs, by the method of "finite elements" (FE method).

The FE method is a model calculation in which the overall area to be investigated is broken down into a finite number of adjacent polygonal "cells", and the relevant elasticity values for each cell are determined numerically, namely, the modules of elasticity, the shear modulus, and the Poisson's ratio in the plane considered. The values determined for each cell are linked with those of the adjacent cells and with the mechanical stress that acts to determine the relative displacement of the corners of the cells vectorially. The vector array so obtained describes the distortion of the overall area. Suitable FE methods are in the prior art and, therefore, do not need to be described more extensively at this point; a reference to the relevant specialist literature suffices, for example, K. J. Bathe, "Finite Elemente Methoden", Springer 1986, O. C. Zienkiewicz, The Finite Element Method, $3^{rd}$ edition, McGraw Hill.

For the numerical determination of the elasticity values of a cell, in each case a sufficiently large data set must be provided to-describe the part of the perforation pattern of the diaphragm located within the cell sufficiently accurately. For example, for a cell whose dimensions are 0.25×0.25 mm on the diaphragm, a data set of up to 1 Gbyte is needed, of which the processing for the numerical determination of the elasticity values lasts about 1 day when a current industrial computer is used. Such a time is unreasonably long because the total area of the perforation pattern of a diaphragm may be 100×100 mm, for example, if full-field exposure of a chip area of the normal size of 25×25 mm is to be carried out on a wafer with a reduced imaging scale of 1:4.

To determine the local distribution of the stiffness of a perforated diaphragm to be used as a perforated mask with reduced computing effort, an empirical function has been determined for specific geometries, which contains the "opening ratio" of the diaphragm as a parameter, that is to say, the ratio of the sum of the cross-sectional areas of all the mask openings to the total area of the mask (cf. the publication by G. A. Frisque et al., which appeared in the Proceedings of 1999 SPIE Symposium on Emerging Lithographic Technologies III, pages 768–778). Specifically, in the method disclosed, a unit load is applied to an "elementary cell" of a pattern and the average stiffness is calculated by using the distortion response determined by FE calculation. An FE calculation is then carried out again, in which the periodically repeating elementary cells are replaced by elements of average stiffness (equivalent stiffness). For particularly symmetrical structures (square arrays in a quadratic outline), an analytical solution for the average stiffness is specified.

However, such a method can be used only for highly symmetrically, isotropically distributed structures. To determine the stiffness distribution of perforated mask diaphragms with complicated anisotropic structures, one has hitherto, therefore, always been directed toward the numerical calculation of the cells. Because of the immense computing effort, such a method cannot be applied to the complete construction of an integrated circuit of normal size.

SUMMARY OF THE INVENTION

It is accordingly an object of the invention to provide a method of producing a perforated mask for particle radiation that overcomes the hereinafore-mentioned disadvantages of the heretofore-known devices and methods of this general type and that carries out production within a tolerable time period even in the case of complicated anisotropic structures of the mask pattern.

With the foregoing and other objects in view, there is provided, in accordance with the invention, a method of producing a perforated mask having a desired pattern of openings for a projection of particle radiation onto a projection area, including the steps of cutting openings in a blank broadened in two dimensions, after the cutting, subjecting the blank to deformation forces leaving a distortion of an expected cut pattern, calculating the distortion in advance by determining values of an elasticity of adjacent cells of the mask with respect to longitudinal and shear stresses in a main plane of the mask on a model having the desired pattern of openings, calculating the vector field of the expected distortion by linking the elasticity values determined with the deformation forces with a FE calculation, selecting a pattern for cutting the blank, the pattern representing the desired pattern with a distortion being an inverse of the calculated distortion, determining geometric variables including a length and a direction of all edge sections of each of the openings and a cross-sectional area of each of the openings by measuring openings of each of the cells of at least a selected subset of cells of the model, and analytically determining the elasticity values of each selected cell from preselected functions containing, as a variable, statistical parameters derived from the determined geometric variables.

In the method according to the invention, therefore, no complicated numerical calculation of the elasticity values of all the cells by time-consuming FE methods is carried out; instead, the average elasticity values of the cells are determined by a statistical analysis and preselected mathematical functions, which can be found empirically. The values of the statistical parameters to be used in such a case can be determined relatively simply and quickly, and their linking with the empirical function requires only a little computing time in each case so that the entire procedure only lasts for a few seconds for each cell (as compared with 1 day in the case of numerical elasticity calculation). The empirical mathematical functions, after they have been determined once, apply in unchanged form to virtually all possible patterns; therefore, only the values of the listed statistical parameters have to be determined as pattern specific variables.

The elasticity values of the cells, determined in a simplified way according to the invention, form the basis for the subsequent FE model calculation for the prior determination of the distortions. In spite of the simplification, this prior determination can be sufficiently accurate.

The invention is based on the novel finding that there is a relatively small set of statistical parameters in the physical structure of a perforated mask that, taken on their own, are sufficient to determine the elasticity values of limited mask areas sufficiently accurately, even for complicated anisotropic structures, and, in that, to calculate the elasticity values, generally applicable mathematical functions may be found that contain only these parameters as a variable. The invention includes the technical implementation of such a finding by specifying a limited number of specific and easily measurable geometric variables, from which the statistical parameters are to be derived to carry out the distortion correction in the course of mask production by using the elasticity information calculated therefrom.

In accordance with another mode of the invention, the edge sections are assumed as being edges of a smallest-area rectangle circumscribing a relevant one of the openings.

In accordance with a further mode of the invention, the following statistical parameters are derived from the geometric variables determined for each of a number of discrete directional areas: a opening ratio equal to a ratio of a sum of cross-sectional areas of all the openings to a total area; an orientation parameter indicating what proportion of the sum of greater edge lengths of the openings falling in a directional area is of the sum of all the greater edge lengths of the openings; and an edge length parameter indicating what proportion of the sum of the edge lengths falling in the directional area is of the sum of all the edge lengths.

In accordance with an added mode of the invention, the moduli of elasticity $E_x$ and $E_y$ in an X direction and a Y direction orthogonal thereto, a shear modulus $G_{xy}$ in the XY plane, and a Poisson's ratio $Q_{xy}$ in the XY plane are determined from the following functions:

$$E_x = E[P(V) + P(O_y) + P(K_y)];$$

$$E_y = E[P(V) + P(O_x) + P(K_x)];$$

$$G_{xy} = G[P(V) + P(O_x) + P(K_y)];\text{ and}$$

$$Q_{xy} = P(V) + P(K_y)$$

where:

P is a respective polynomial of a variable indicated in brackets of the functions; and E = a modulus of elasticity of a material of the mask blank;

G = a shear modulus of the material of the mask blank;

V = 1 − (the opening ratio);

$O_x$ = an orientation parameter for the X direction;

$O_y$ = an orientation parameter for the Y direction;

$K_x$ = an edge length parameter for the X direction; and $K_y$ = an edge length parameter for the Y direction.

In accordance with an additional feature of the invention, $E_x$, $E_y$, $G_{xy}$, and $Q_{xy}$ are determined with the functions:

$$E_x = [a_1 \cdot V + a_2 \cdot V^2 + a_3 \cdot V^3 + a_4 \cdot (0.5 - O_y) +$$
$$a_5 \cdot (0.5 - O_y)^2 + a_6 \cdot (0.5 - O_y)^3 + a_7 \cdot (0.5 - K_y)];$$

$$E_y = E[b_1 \cdot V + b_2 \cdot V^2 + b_3 \cdot V^3 + b_4 \cdot (0.5 - O_x) +$$
$$b_5 \cdot (0.5 - O_x)^2 + b_6 \cdot (0.5 - O_x)^3 + b_7 \cdot (0.5 - K_x)];$$

$$G_{xy} = G[c_1 \cdot V + c_2 \cdot V^2 + c_3 \cdot V^3 + c_4 \cdot (0.5 - O_x) +$$
$$c_5 \cdot (0.5 - O_x)^2 + c_6 \cdot (0.5 - O_x)^3 + c_7 \cdot (0.5 - K_y)];\text{ and}$$

$$Q_{xy} = d_1 \cdot V + d_2 \cdot V^2 + d_3 \cdot V^3 + d_4 \cdot (0.5 - O_x) + d_5 \cdot (0.5 - O_x)^2 +$$
$$d_6 \cdot (0.5 - O_x)^3 + d_7 \cdot (0.5 - k_y)],\text{ and}$$

the coefficients $a_1$ to $a_7$, $b_1$ to $b_7$, $c_1$ to $c_7$, and $d_1$ to $d_7$ are empirically determined. Preferably, in accordance with a concomitant feature of the invention:

$-17.81 \leq a_1 \leq -11.87$;

$+31.08 \leq a_2 \leq +46.62$;

$-29.78 \leq a_3 \leq -19.86$;

$-2.36 \leq a_4 \leq -1.58$;

$+3.94 \leq a_5 \leq +5.92$;

$+0.46 \leq a_6 \leq +0.70$;

$+4.21 \leq a_7 \leq +6.31$;

$+5.65 \leq b_1 \leq 8.47$;

$-23.80 \leq b_2 \leq -15.86$;

$+12.15 \leq b_3 \leq +18.23$;

$-3.49 \leq b_4 \leq -2.33$;

$-26.75 \leq b_5 \leq -17.83$;

$+30.39 \leq b_6 \leq +45.59$;

$+6.22 \leq b_7 \leq +9.37$;

$+7.89 \leq c_1 \leq +11.83$;

$-32.50 \leq c_2 \leq -21.66$;

$+15.09 \leq c_3 \leq +22.63$;

$-2.11 \leq c_4 \leq -1.41$;

$+2.15 \leq c_5 \leq +3.23$;

$-8.12 \leq c_6 \leq -5.42$;

$-3.12 \leq c_7 \leq -2.08$;

$+44.72 \leq d_1 \leq +67.08$;

$-168.04 \leq d_2 \leq -122.02$;

$+69.80 \leq d_3 \leq +104.70$;

$-16.25 \leq d_4 \leq -10.83$;

$+16.60 \leq d_5 \leq +24.90$;

$-75.64 \leq d_6 \leq -50.42$; and $-26.83 \leq d_7 \leq -17.89$.

Other features that are considered as characteristic for the invention are set forth in the appended claims.

Although the invention is illustrated and described herein as embodied in a method of producing a perforated mask for particle radiation, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

DESCRIPTION OF THE PREFERRED EMBODIMENTS

Figure 1:
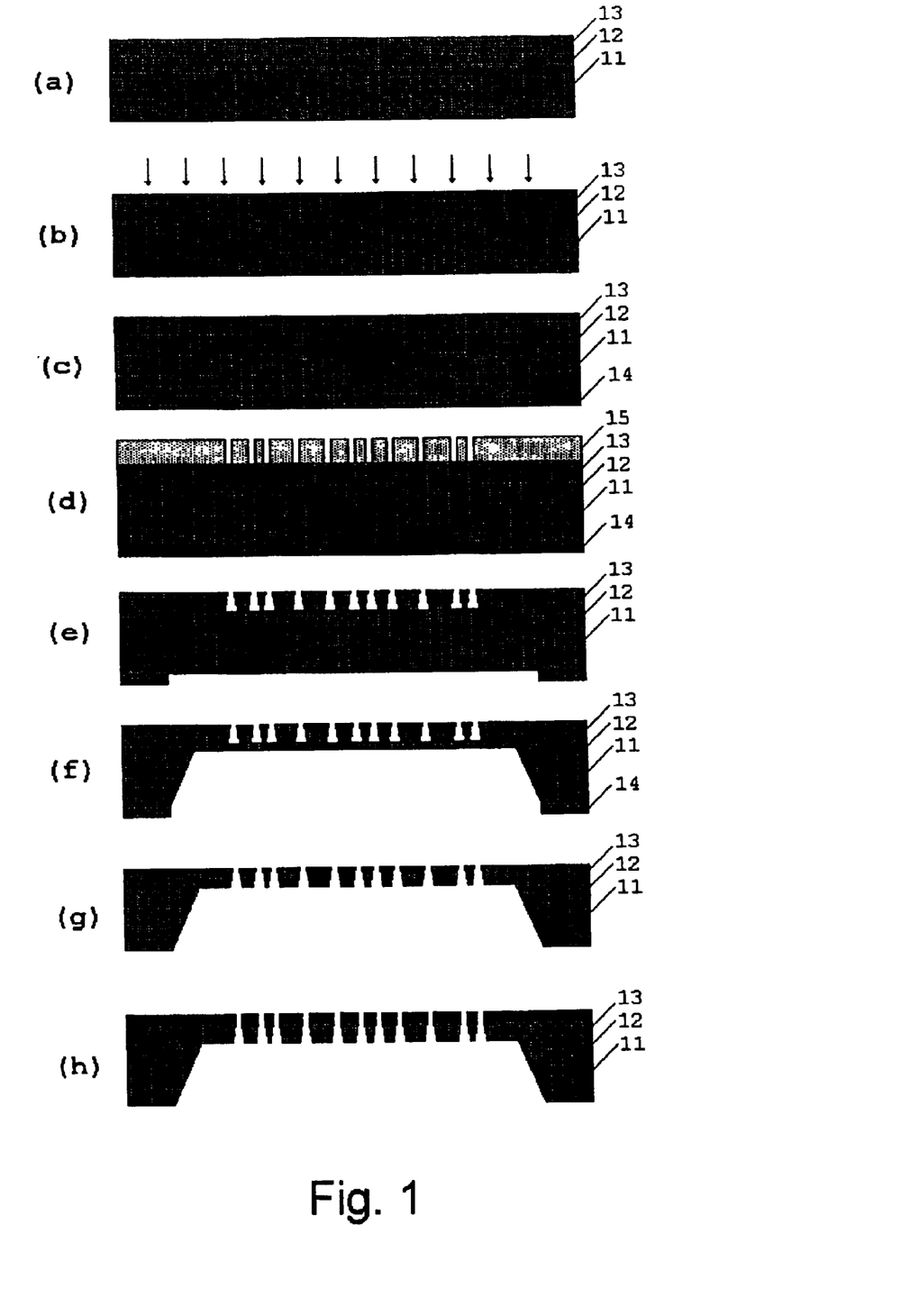
FIG. 1 is a diagrammatic cross-sectional illustration of various stages (a) to (h) of a workpiece in the course of the production of a perforated mask according to the invention.

Referring now to the figures of the drawings in detail and first, particularly to FIG. 1 thereof, there is shown a production of a perforated mask. The starting material for the perforated mask to be produced is a layer structure having a lower layer 11 of silicon (Si), a middle thin oxide layer 12 of silicon dioxide ($SiO_2$), and an upper, relatively thin silicon layer 13. By doping with ion irradiation (typically boron), as indicated by the arrows in FIG. 1(b), and subsequent thermal healing, a mechanical layer covering the upper silicon layer 13 is established. Because of the smaller atomic radius of boron as compared with silicon, the result is a tensile stress that increases with increasing doping concentration. Then, according to FIG. 1(c), the rear of the structure is coated with a protective layer 14 of silicon nitride to protect the rear from etching in the subsequent process steps.

In a next step, the front is coated with a varnish layer that is sensitive to electrons and exposed in a desired pattern by electron radiation. Such exposure can be carried out by scanning with a fine electron beam or block by block with the aid of partial masks, the latter if desired with imaging reduction by an electron lens. Following the development of the varnish layer, the exposed areas are washed away, so that the structure of recesses in the varnish layer 15 shown in FIG. 1(d) is produced, the recesses corresponding to the exposure pattern.

In a subsequent etching step, the upper thin silicon layer 13 is structured at the locations of the recesses in the varnish layer 15 and etched as far as the start of the oxide layer 12 lying underneath. The varnish layer is then removed, and a rear window, which defines the subsequent diaphragm area, is opened lithographically in the lower nitride layer 14. The result of these procedures is shown in FIG. 1(e).

Then, according to FIG. 1(f), the lower thick silicon layer 11 is removed by etching, the areas of the nitride layer 14 that have remained during the previous step serving as a mask. In the same way as in the structuring of the upper silicon layer 13, the oxide layer 12 serves as an etch stop layer. Next, according to FIG. 1(g), the oxide layer 12 is removed in its exposed areas, as is the rest of the nitride layer 14 so that the central part of the thin silicon layer 13 is obtained as a free-standing structured diaphragm having openings corresponding to the exposure pattern. Because the overall stiffness of the system is changed by the removal of parts of the lower thick silicon layer 11, the layer stress (and, therefore, the elastic energy) can be reduced, deforming the thin diaphragm, that is to say, the diaphragm is de-stressed, by its overall area being reduced and by the stabilizing ring, which surrounds the diaphragm and is of the rest of the thick silicon layer 11, being bent inward. The perforated areas with their lower stiffness can expand during such deformation.

To protect the diaphragm formed from further doping during subsequent irradiation with ions, and, therefore, to avoid a change in the layer stress, according to FIG. 1(h) a protective layer (typically carbon) that has a constant layer stress under ion irradiation is deposited onto the upper silicon layer 13.

Figure 2:
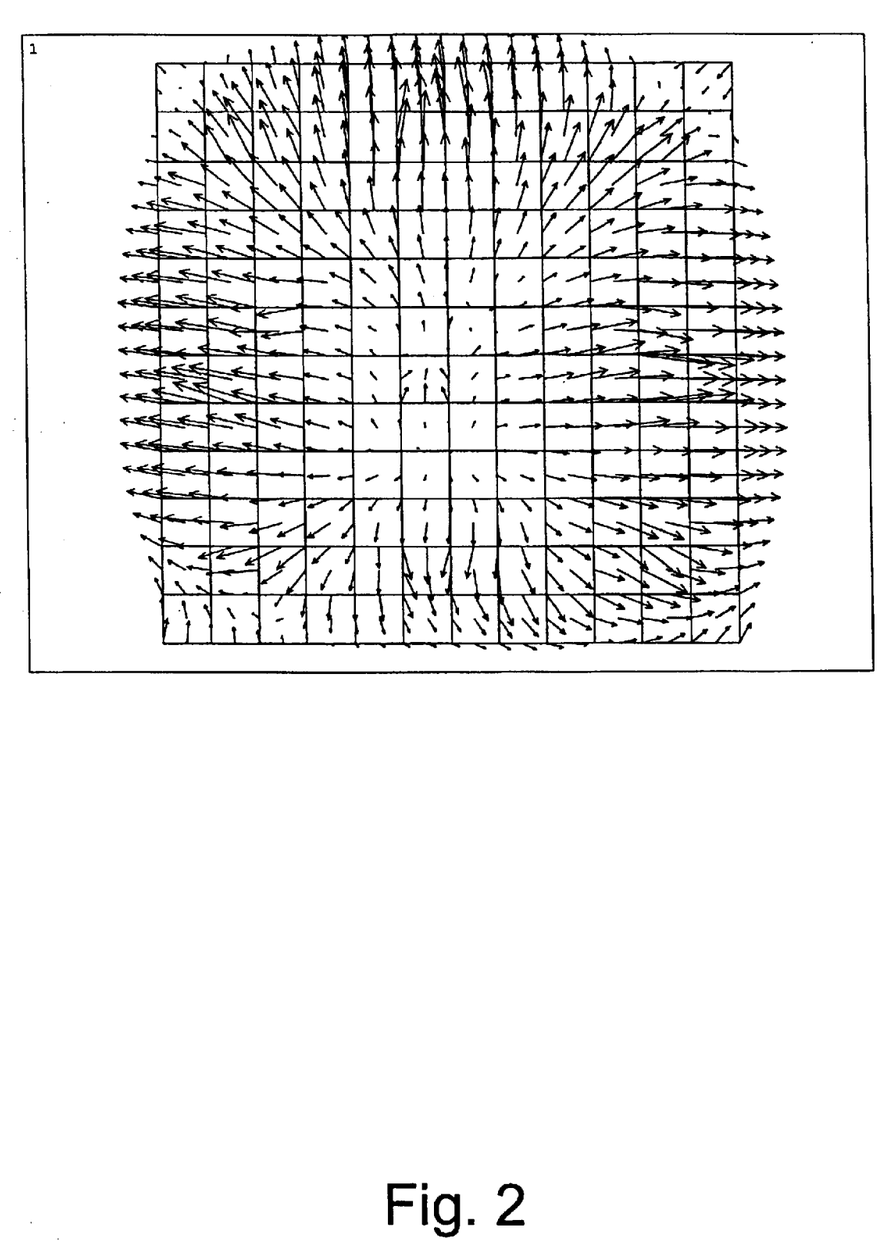
FIG. 2 is a graph of a vector array of a possible distortion of the mask according to the invention following production of the mask.

During the de-stressing of the diaphragm, the pattern of the mask openings distorts in a manner that depends on the structure of the pattern. Various points on the diaphragm are displayed in the plane of the main surface of the mask (XY plane) in various directions and amounts because the mask openings lead to the stiffness of the diaphragm with respect to longitudinal and shear forces being different from point to point in the XY plane. FIG. 2 illustrates an exemplary vector array for the case of a non-uniform and anisotropic pattern, in which each vector indicates the amount and the direction of the displacement of the relevant point.

So that the pattern of the mask has the desired final form after de-stressing, the pattern selected for cutting the openings must be distorted with respect to the desired final form in a manner that is the inverse of the distortion resulting during de-stressing. This means that the distortion to be expected during de-stressing must be determined in advance as accurately as possible. As already described above, such a determination is possible by FE calculation, but for which purpose the elasticity values of the cells must be determined.

According to the invention, the determination of the elasticity values of the individual cells is carried out based upon statistically parameters by using a model of the desired mask pattern. The statistical parameters are derived from relatively few geometric variables for each opening, which may be determined quickly by measuring openings in the model, namely, the length and direction of all the edge sections and the cross-sectional area of the opening.

Figure 3:
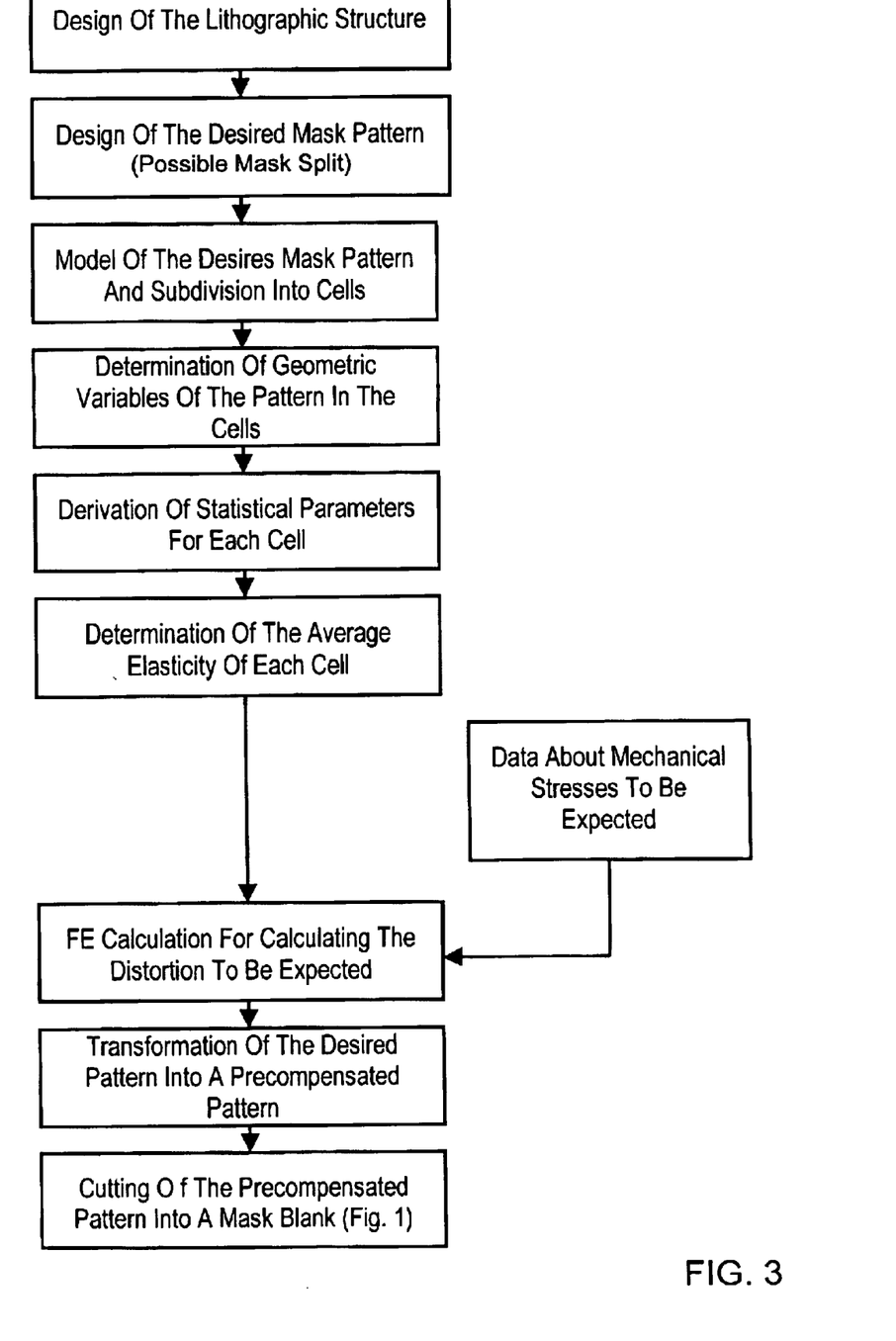
FIG. 3 is a simplified flowchart of significant steps in a method according to the invention.

FIG. 3 provides an overall view of the sequence of the important steps for the preparation and implementation of a method of mask production according to one embodiment of the invention.

Following the construction of the structure to be formed by particle beam lithography, for example, the structure of a pattern to be formed lithographically on the surface of a wafer, the pattern in which the area to be structured is to be exposed through an appropriately configured perforated mask is configured. However, the structure to be formed can contain areas that cannot be represented by a corresponding opening in a single perforated mask. As can easily be seen, for example, an annular opening in a perforated-mask is not possible. Accordingly, an annular structured area can be exposed only by the successive use of two perforated masks, each of which representing part of the ring. In most cases, it is, therefore, necessary to "split" the exposure pattern into (at least) two partial patterns that compliment each other to form the overall pattern and to configure a dedicated mask for each of these partial patterns ("mask split").

Following these preparatory construction steps, a model of the mask configuration is made ready, that is to say, a model of the pattern of openings in a perforated mask desired for the exposure. The model is preferably made ready in virtual form as an image file that can be processed in a computer. The model is subdivided into a large number of cells, and the individual openings within the cells are measured to obtain the aforementioned geometric variables, that is to say, the length and the direction of the edge sections of each opening and the cross-sectional area of each opening. A suitable image analysis program in a computer using the virtual image representation can carry out such a measurement. From the aforementioned geometric variables, for each cell, statistical parameters are derived that are deterministic of the average stiffness of the cell, that is to say, deterministic of the directional components of the average modulus of elasticity, the average shear modulus, and the average Poisson's ratio.

In a particular embodiment of the invention, to derive the statistical parameters, the possible edge directions are classified in a limited number of discrete directional areas $\alpha_i$. For each of the directional areas $\alpha_i$, the following statistical parameters are preferably calculated:

an "orientation parameter" $O_i$, which indicates what proportion the sum of the greater edge lengths of the openings falling in the directional area $\alpha_i$ forms of the sum of all the greater edge lengths of the openings;

an "edge length parameter" $K_i$, which indicates what proportion the sum of the edge lengths falling in the directional area $\alpha_i$ forms of the sum of all the edge lengths; and the "opening ratio," which is the ratio of the sum of the cross-sectional areas of all the openings to the total area.

The calculation of the statistical parameters can be simplified if the edge lengths of an opening are assumed to be the side lengths of a rectangle that is the smallest-area circumscribing "bounding rectangle" (so-called pattern bounding box) of the opening. If the opening is, itself, a rectangle, then the opening and pattern bounding box are identical, and the simplification does not result in any loss of accuracy. The closer the shape of an opening comes to the pattern bounding box, the better will be the result of the simplified calculation. It has been shown that a structure to be formed on a wafer normally includes mutually separated individual areas whose shape approaches the respective pattern bounding box sufficiently closely so that the simplified calculation of the statistical parameters by using the side lengths of the pattern bounding box is sufficient. If desired, as early as during the aforementioned mask splitting, care can be taken so that structural areas that deviate sharply from a rectangular shape are split into (at least approximately) rectangular components, which are then assigned to different split masks.

A further simplification is possible if the desired pattern of the mask includes openings whose edge sections, wholly or very predominantly, follow only two orthogonal directions X and Y. Such a precondition is often fulfilled in the case of masks for the lithographic processing of wafers or, if desired, can be fulfilled by corresponding specific configuration during the layout of the structure to be created on the wafer. It is then sufficient to select only these two directions X and Y as the directional areas $\alpha_i$ for the edges of the openings during the calculation of the statistical parameters.

The statistical parameters that have been calculated from the geometric variables determined are used as a variable in empirical functions that describe the average elasticity values of the cells of a mask that has openings corresponding to the desired pattern. For the case described above, in which only edge directions in an X direction and a Y direction at right angles thereto need to be taken into account (which is sufficient in many cases), the following statistical parameters are determined from the geometric variables determined:

a parameter V, which is equal to 1 minus the opening ratio;

the orientation parameter $O_x$ for the X direction;

the orientation parameter $O_y$ for the Y direction; the edge length parameter $K_x$ for the X direction;

the edge length parameter $K_y$ for the Y direction.

From these parameters, the moduli of elasticity $E_x$ and $E_y$ in the X direction and Y direction, the shear modulus $G_{xy}$ in the XY plane, and the Poisson's ratio $Q_{xy}$ in the XY plane are determined by using empirical functions. Use is preferably made of functions of the following type:

$$E_x = E[P(V) + P(O_y) + P(K_y)];$$

$$E_y = E[P(V) + P(O_x) + P(K_x)];$$

$$G_{xy} = G[P(V) + P(O_x) + P(K_y)]; \text{ and}$$

$$Q_{xy} = P(V) + P(K_y)$$

where:

P is, in each case, a polynomial of the variables indicated in the brackets ( );
E is the modulus of elasticity; and
G is the shear modulus of the mask material.

In the case of silicon, E=130100 MPa and G=79600 MPa.

It has been shown that it may be sufficient, for the variables $O_x$ and $O_y$, in each case, to use polynomials of third order and, for the variables $K_x$ and $K_y$, in each case, to use polynomials of the first order, to be specific, preferably, such that:

$$E_x = E[a_1 \cdot V + a_2 \cdot V^2 + a_3 \cdot V^3 + a_4 \cdot (0.5 - O_y) +$$

$$a_5 \cdot (0.5 - O_y)^2 + a_6 \cdot (0.5 - O_y)^3 + a_7 \cdot (0.5 - K_y)];$$

$$E_y = E[b_1 \cdot V + b_2 \cdot V^2 + b_3 \cdot V^3 + b_4 \cdot (0.5 - O_x) +$$

$$b_5 \cdot (0.5 - O_x)^2 + b_6 \cdot (0.5 - O_x)^3 + b_7 \cdot (0.5 - K_x)];$$

$$G_{xy} = G[c_1 \cdot V + c_2 \cdot V^2 + c_3 \cdot V^3 + c_4 \cdot (0.5 - O_x) + c_5 \cdot (0.5 - O_x)^2 +$$

$$c_6 \cdot (0.5 - O_x)^3 + c_7 \cdot (0.5 - K_y)]; \text{ and}$$

$$Q_{xy} = d_1 \cdot V + d_2 \cdot V^2 + d_3 \cdot V^3 + d_4 \cdot (0.5 - O_x) +$$

$$d_5 \cdot (0.5 - O_x)^2 + d_6 \cdot (0.5 - O_x)^3 + d_7 \cdot (0.5 - k_y)].$$

The coefficients $a_1$ to $a_7$, $b_1$ to $b_7$, $c_1$ to $c_7$, and $d_1$ to $d_7$ can be determined empirically. For example, it could be established that the above functions reproduce the elasticity values looked for sufficiently accurately with the following selection of coefficients:

| | | | |
|---|---|---|---|
| $a_1 = -14.84$; | $a_2 = +38.85$; | $a_3 = -24.82$; | |
| $a_4 = -1.97$; | $a_5 = +4.93$; | $a_6 = +0.58$; | $a_7 = +5.26$; |
| $b_1 = +7.06$; | $b_2 = -19.83$; | $b_3 = +15.19$; | |
| $b_4 = -2.91$; | $b_5 = -22.29$; | $b_6 = +37.99$; | $b_7 = +7.78$; |
| $c_1 = +9.86$; | $c_2 = -27.08$ | $c_3 = +18.86$; | |
| $c_4 = -1.76$; | $c_5 = +2.69$ | $c_6 = -6.77$; | $c_7 = -2.60$; |
| $d_1 = +55.99$; | $d_2 = -140.03$; | $d_3 = +87.25$; | |
| $d_4 = -13.54$; | $d_5 = +20.75$; | $d_6 = -63.03$; | $d_7 = -22.36$ |

Figure 4:
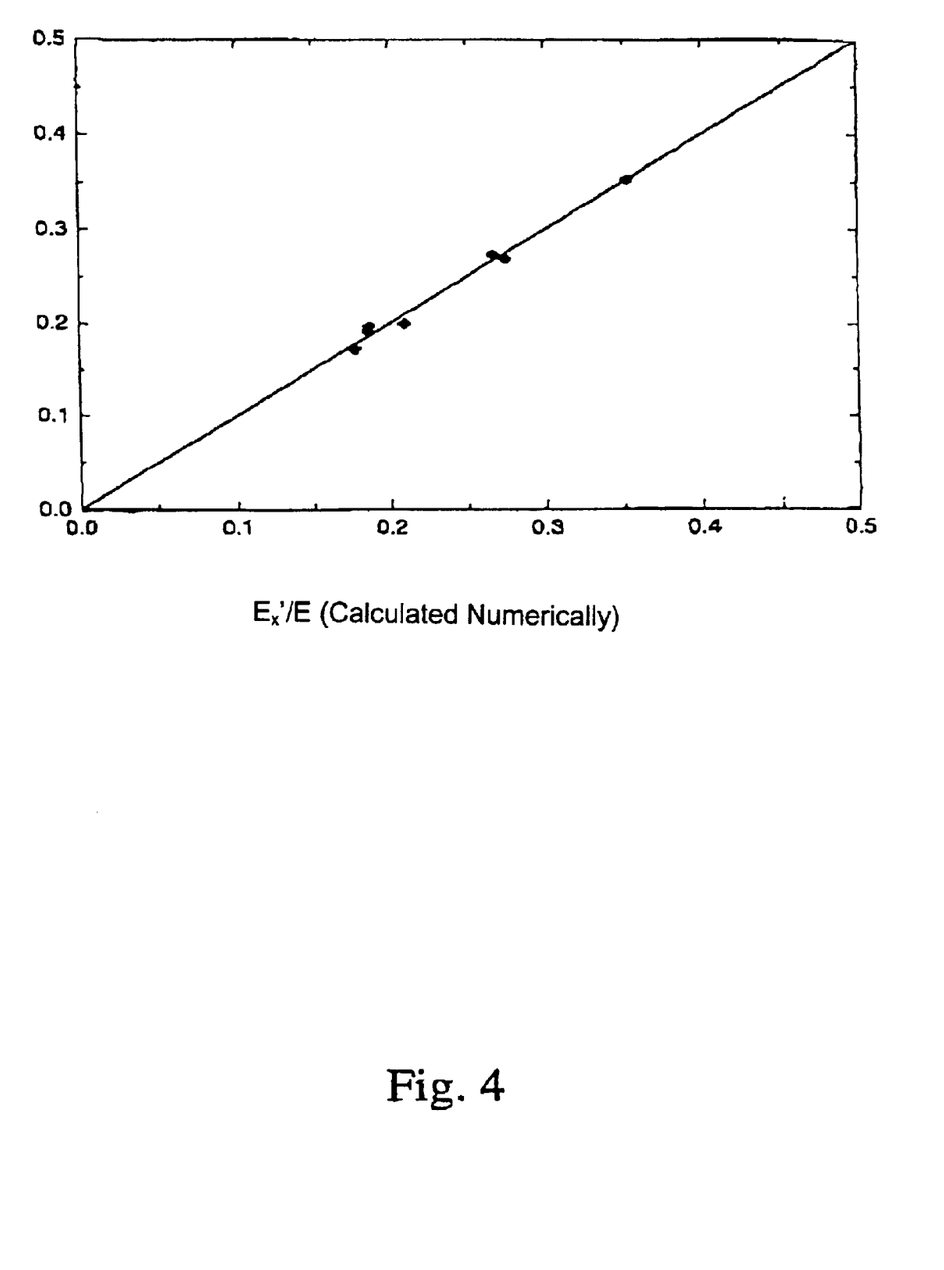
FIG. 4 is a graph illustrating results of an analytical determination according to the invention of elasticity values, as compared with the results of a numerical determination.

The accuracy that can be achieved by analytical calculation by the above functions, using the coefficient values specified above, was verified for some representative cells of different pattern structure by comparing the results with the average elasticity values that were obtained numerically for these cells by a much more complicated FE calculation. FIG. 4 illustrates results from such a comparison, specifically, using the example of the modulus of elasticity $E_x$ from six differently structured cells. Plotted on the x axis is a range going from 0 to 0.5 of the numerically calculated relative modulus of elasticity $E_x'/E$, and plotted on the y axis is the range going from 0 to 0.5 of the relative modulus of elasticity $E_x/E$ determined analytically in accordance with the invention. The straight line represents the ideal case in which each analytically determined value agrees exactly with the numerically calculated value. The six black points show only very slight deviations of the analytically determined values from the numerically calculated values for the six different cells.

Useable results can also be achieved if a departure is made within certain limits from the coefficient values specified above. However, the deviations should be no more than ±20%.

Of course, the invention is not restricted to the use of the mathematical functions specified above; other suitable functions or polynomials of other orders with other coefficients may also be found. This can be done by the specific application of trial and error methods, specifically, by using a model cell whose elasticity values are calculated numerically and are, in each case, compared with the results of the functions tried. Although such a process may be time-consuming, it needs to be carried out only once. If analytical functions that come sufficiently close to the result of the numerical calculation have been found once, they can be used continually for any desired pattern for the statistical (and, therefore, time-saving) analysis thereof.

Reference will now be made again to the flowchart illustrated in FIG. 3. Once the analytically determined data about the average elasticity values of each cell are available, the vector array of the distortion of the diaphragm to be expected is calculated by a conventional FE calculation. Included in such a FE calculation is the mechanical stress that is established in the diaphragm during the cutting process. If necessary, the mechanical loading that results from the holding of the diaphragm during its use can also be included. These stresses and loads can be predicted quantitatively from the process parameters. By using the calculated distortion vector array, the virtual image of the desired pattern can be transformed by current image processing methods such that the result is a "precompensated" image, which represents the desired pattern only after the distortion. Such a precompensated pattern image then forms the original for the cutting of the openings in the mask blank, for example, the original for the pattern that is introduced into the varnish layer 15 during the process illustrated in FIG. 1.

The details described above are only one example of the implementation of a method according to the invention. The invention is not restricted to this example; instead, numerous modifications and variants are possible to realize a technical success in accordance with the general principle of the invention.

For example, under certain circumstances, it may already be sufficiently advantageous to calculate only a subset of cells of the pattern by the statistical analysis according to the invention instead of all of the cells, and to calculate the rest numerically. Furthermore, additional geometric variables can also be determined, and the geometric variables determined can also be used to derive other or additional statistical parameters for whose linking other suitable analytical functions may be found empirically. Other or further statistical parameters that can be used are, for example, the side ratio of the openings or pattern bounding boxes and the distribution of the width and spacing of the openings or pattern bounding boxes. Such a distribution can be derived by calculation and separate statistical registration of the lengths and the spacing of parallel edges that define the width of an opening in each case, and of parallel edges that define the spacing between openings.

If necessary, the statistical parameters can be derived in classified form by being calculated separately for discrete value ranges of the geometric variables. Each of the parameters so classified, if desired, provided with its own weighting coefficient, could form a variable in the functions from which the elasticity values are determined analytically.

We claim:

1. A method of producing a perforated mask having a desired pattern of openings for a projection of particle radiation onto a projection area, which comprises:

cutting openings in a blank broadened in two dimensions;

after the cutting, subjecting the blank to deformation forces leaving a distortion of an expected cut pattern;

calculating the distortion in advance by determining values of an elasticity of adjacent cells of the mask with respect to longitudinal and shear stresses in a main plane of the mask on a model having the desired pattern of openings;

calculating the vector field of the expected distortion by linking the elasticity values determined with the deformation forces with a FE calculation;

selecting a pattern for cutting the blank, the pattern representing the desired pattern with a distortion being an inverse of the calculated distortion;

determining geometric variables including a length and a direction of all edge sections of each of the openings and a cross-sectional area of each of the openings by measuring openings of each of the cells of at least a selected subset of cells of the model; and analytically determining the elasticity values of each selected cell from preselected functions containing, as a variable, statistical parameters derived from the determined geometric variables.

2. The method according to claim 1, wherein the preselected functions are empirical functions.

3. The method according to claim 1, which further comprises assuming the edge sections as being edges of a smallest-area rectangle circumscribing a relevant one of the openings.

4. The method according to claim 1, which further comprises deriving the following statistical parameters from the geometric variables determined for each of a number of discrete directional areas:

an opening ratio equal to a ratio of a sum of cross-sectional areas of all the openings to a total area;

an orientation parameter indicating what proportion of the sum of greater edge lengths of the openings falling in a directional area is of the sum of all the greater edge lengths of the openings; and an edge length parameter indicating what proportion of the sum of the edge lengths falling in the directional area is of the sum of all the edge lengths.

5. The method according to claim 4, which further comprises determining moduli of elasticity $E_x$ and $E_y$ in an X direction and a Y direction orthogonal thereto, a shear modulus $G_{xy}$ in the XY plane, and a Poisson's ratio $Q_{xy}$ in the XY plane from the following functions:

$$E_x = E[P(V) + P(O_y) + P(K_y)];$$

$$E_y = E[P(V) + P(O_x) + P(K_x)];$$

$$G_{xy} = G[P(V) + P(O_x) + P(K_y)]; \text{ and}$$

$$Q_{xy} = P(V) + P(K_y)$$

where:

P is a respective polynomial of a variable indicated in brackets of the functions; and E=a modulus of elasticity of a material of the mask blank;

G=a shear modulus of the material of the mask blank;

V=1−(the opening ratio);

$O_x$=an orientation parameter for the X direction;

$O_y$=an orientation parameter for the Y direction;

$K_x$=an edge length parameter for the X direction; and $K_y$=an edge length parameter for the Y direction.

6. The method according to claim 5, which further comprises:

determining $E_x$, $E_y$, $G_{xy}$ and $Q_{xy}$ with the functions:

$$E_x = [a_1 \cdot V + a_2 \cdot V^2 + a_3 \cdot V^3 + a_4 \cdot (0.5 - O_y) +$$
$$a_5 \cdot (0.5 - O_y)^2 + a_6 \cdot (0.5 - O_y)^3 + a_7 \cdot (0.5 - K_y)];$$

$$E_y = E[b_1 \cdot V + b_2 \cdot V^2 + b_3 \cdot V^3 + b_4 \cdot (0.5 - O_x) +$$
$$b_5 \cdot (0.5 - O_x)^2 + b_6 \cdot (0.5 - O_x)^3 + b_7 \cdot (0.5 - K_x)];$$

$$G_{xy} = G[c_1 \cdot V + c_2 \cdot V^2 + c_3 \cdot V^3 + c_4 \cdot (0.5 - O_x) +$$
$$c_5 \cdot (0.5 - O_x)^2 + c_6 \cdot (0.5 - O_x)^3 + c_7 \cdot (0.5 - K_y)]; \text{ and}$$

$$Q_{xy} = d_1 \cdot V + d_2 \cdot V^2 + d_3 \cdot V^3 + d_4 \cdot (0.5 - O_x) + d_5 \cdot (0.5 - O_x)^2 +$$
$$d_6 \cdot (0.5 - O_x)^3 + d_7 \cdot (0.5 - K_y)], \text{ and}$$

empirically determining coefficients $a_1$ to $a_7$, $b_1$ to $b_7$, $c_1$ to $c_7$, and $d_1$ to $d_7$.

7. The method according to claim 6, wherein:
$-17.81 \leq a_1 \leq -11.87$;
$+31.08 \leq a_2 \leq +46.62$;
$-29.78 \leq a_3 \leq -19.86$;
$-2.36 \leq a_4 \leq -1.58$;
$+3.94 \leq a_5 \leq +5.92$;
$+0.46 \leq a_6 \leq +0.70$;
$+4.21 \leq a_7 \leq +6.31$;
$+5.65 \leq b_1 \leq 8.47$;
$-23.80 \leq b_2 \leq -15.86$;
$+12.15 \leq b_3 \leq +18.23$;
$-3.49 \leq b_4 \leq -2.33$;
$-26.75 \leq b_5 \leq -17.83$;
$+30.39 \leq b_6 \leq +45.59$;
$+6.22 \leq b_7 \leq +9.37$;
$+7.89 \leq c_1 \leq +11.83$;
$-32.50 \leq c_2 \leq -21.66$;
$+15.09 \leq c_3 \leq +22.63$;
$-2.11 \leq c_4 \leq -1.41$;
$+2.15 \leq c_5 \leq +3.23$;
$-8.12 \leq c_6 \leq -5.42$;
$-3.12 \leq c_7 \leq -2.08$;
$+44.72 \leq d_1 \leq +67.08$;
$-168.04 \leq d_2 \leq -122.02$;
$+69.80 \leq d_3 \leq +104.70$;
$-16.25 \leq d_4 \leq -10.83$;
$+16.60 \leq d_5 \leq +24.90$;
$-75.64 \leq d_6 \leq -50.42$; and
$-26.83 \leq d_7 \leq -17.89$.

8. The method according to claim 3, which further comprises deriving the following statistical parameters from the geometric variables determined for each of a number of discrete directional areas:

an opening ratio equal to a ratio of a sum of cross-sectional areas of all the openings to a total area;

an orientation parameter indicating what proportion of the sum of greater edge lengths of the openings falling in a directional area is of the sum of all the greater edge lengths of the openings; and an edge length parameter indicating what proportion of the sum of the edge lengths falling in the directional area is of the sum of all the edge lengths.

9. The method according to claim 8, which further comprises determining moduli of elasticity $E_x$ and $E_y$ in an X direction and a Y direction orthogonal thereto, a shear modulus $G_{xy}$ in the XY plane, and a Poisson's ratio $Q_{xy}$ in the XY plane from the following functions:

$$E_x = E[P(V) + P(O_y) + P(K_y)];$$

$$E_y = E[P(V) + P(O_x) + P(K_x)];$$

$$G_{xy} = G[P(V) + P(O_x) + P(K_y)]; \text{ and}$$

$$Q_{xy} = P(V) + P(K_y)$$

where:

P is a respective polynomial of a variable indicated in brackets of the functions; and E=a modulus of elasticity of a material of the mask blank;
G=a shear modulus of the material of the mask blank;
V=1−(the opening ratio);
$O_x$=an orientation parameter for the X direction;
$O_y$=an orientation parameter for the Y direction;
$K_x$=an edge length parameter for the X direction; and
$K_y$=an edge length parameter for the Y direction.

10. The method according to claim 9, which further comprises:

determining $E_x$, $E_y$, $G_{xy}$, and $Q_{xy}$ with the functions:

$$E_x = [a_1 \cdot V + a_2 \cdot V^2 + a_3 \cdot V^3 + a_4 \cdot (0.5 - O_y) +$$
$$a_5 \cdot (0.5 - O_y)^2 + a_6 \cdot (0.5 - O_y)^3 + a_7 \cdot (0.5 - K_y)];$$

$$E_y = E[b_1 \cdot V + b_2 \cdot V^2 + b_3 \cdot V^3 + b_4 \cdot (0.5 - O_x) +$$
$$b_5 \cdot (0.5 - O_x)^2 + b_6 \cdot (0.5 - O_x)^3 + b_7 \cdot (0.5 - K_x)];$$

$$G_{xy} = G[c_1 \cdot V + c_2 \cdot V^2 + c_3 \cdot V^3 + c_4 \cdot (0.5 - O_x) +$$
$$c_5 \cdot (0.5 - O_x)^2 + c_6 \cdot (0.5 - O_x)^3 + c_7 \cdot (0.5 - K_y)]; \text{ and}$$

$$Q_{xy} = d_1 \cdot V + d_2 \cdot V^2 + d_3 \cdot V^3 + d_4 \cdot (0.5 - O_x) + d_5 \cdot (0.5 - O_x)^2 +$$
$$d_6 \cdot (0.5 - O_x)^3 + d_7 \cdot (0.5 - K_y)], \text{ and}$$

empirically determining coefficients $a_1$ to $a_7$, $b_1$ to $b_7$, $c_1$ to $c_7$, and $d_1$ to $d_7$.

11. The method according to claim 10, wherein:
$-17.81 \leq a_1 \leq -11.87$;
$+31.08 \leq a_2 \leq +46.62$;
$-29.78 \leq a_3 \leq -19.86$;
$-2.36 \leq a_4 \leq -1.58$;
$+3.94 \leq a_5 \leq +5.92$;
$+0.46 \leq a_6 \leq +0.70$;
$+4.21 \leq a_7 \leq +6.31$;
$+5.65 \leq b_1 \leq 8.47$;
$-23.80 \leq b_2 \leq -15.86$;
$+12.15 \leq b_3 \leq +18.23$;
$-3.49 \leq b_4 \leq -2.33$;
$-26.75 \leq b_5 \leq -17.83$;
$+30.39 \leq b_6 \leq +45.59$;
$+6.22 \leq b_7 \leq +9.37$;
$+7.89 \leq c_1 \leq +11.83$;
$-32.50 \leq c_2 \leq -21.66$;
$+15.09 \leq c_3 \leq +22.63$;
$-2.11 \leq c_4 \leq -1.41$;
$+2.15 \leq c_5 \leq +3.23$;
$-8.12 \leq c_6 \leq -5.42$;
$-3.12 \leq c_7 \leq -2.08$;
$+44.72 \leq d_1 \leq +67.08$;
$-168.04 \leq d_2 \leq -122.02$;
$+69.80 \leq d_3 \leq +104.70$;
$-16.25 \leq d_4 \leq -10.83$;
$+16.60 \leq d_5 \leq +24.90$;
$-75.64 \leq d_6 \leq -50.42$; and
$-26.83 \leq d_7 \leq -17.89$.

* * * * *